United States Patent
Shinagawa et al.

(10) Patent No.: US 6,733,930 B2
(45) Date of Patent: May 11, 2004

(54) PHOTOMASK BLANK, PHOTOMASK AND METHOD OF MANUFACTURE

(75) Inventors: Tsutomu Shinagawa, Niigata-ken (JP); Tamotsu Maruyama, Niigata-ken (JP); Hideo Kaneko, Niigata-ken (JP); Mikio Kojima, Niigata-ken (JP); Yukio Inazuki, Niigata-ken (JP); Satoshi Okazaki, Niigata-ken (JP)

(73) Assignee: Shin-Etsu Chemical Co., LTD, Tokyo (JP)

( * ) Notice: Subject to any disclaimer, the term of this patent is extended or adjusted under 35 U.S.C. 154(b) by 134 days.

(21) Appl. No.: 10/073,415

(22) Filed: Feb. 13, 2002

(65) Prior Publication Data

US 2002/0136966 A1 Sep. 26, 2002

(30) Foreign Application Priority Data

Feb. 13, 2001 (JP) ........................... 2001-035783

(51) Int. Cl.$^7$ ................................. G03F 9/00
(52) U.S. Cl. ................................................ 430/5
(58) Field of Search ..................... 430/5, 322, 323, 430/324; 204/192.11

(56) References Cited

U.S. PATENT DOCUMENTS

| | | | | |
|---|---|---|---|---|
| 4,096,026 A | | 6/1978 | Takeuchi | ............ 156/656 |
| 4,563,407 A | | 1/1986 | Matsui et al. | ............ 430/5 |
| 5,415,953 A | * | 5/1995 | Alpay et al. | ............ 430/5 |
| 6,037,083 A | * | 3/2000 | Mitsui | ............ 430/5 |

FOREIGN PATENT DOCUMENTS

| | | |
|---|---|---|
| EP | 1 152 291 A2 | 11/2001 |
| JP | 61-46821 B2 | 10/1986 |
| JP | 62-27386 B | 6/1987 |
| JP | 62-27387 B2 | 6/1987 |
| JP | 62-37385 B2 | 8/1987 |
| JP | 62-37386 B | 8/1987 |
| JP | 4-9847 A | 1/1992 |

OTHER PUBLICATIONS

English Language Abstract of JP–59–087458 A (May 21, 1984).
English Language Abstract of JP–60–103350 (Jun. 7, 1985).
English Language Abstract of JP–61–176934 (Aug. 8, 1986).
English Language Abstract of JP–04–009847 (Jan. 14, 1992).

* cited by examiner

Primary Examiner—S. Rosasco
(74) Attorney, Agent, or Firm—Birch, Stewart, Kolasch & Birch, LLP

(57) ABSTRACT

In a photomask blank comprising a light-shielding film and an antireflective film on a transparent substrate, the light-shielding film and the antireflective film are formed of a chromium base material containing oxygen, nitrogen and carbon such that the content of carbon decreases stepwise or continuously from a surface side toward the substrate. The photomask blank can be etched at a controlled rate to produce perpendicular walls. A photomask is manufactured by lithographically patterning the photomask blank. The photomask blank and photomask have uniform film properties and contribute to the microfabrication of semiconductor ICs of greater density and finer feature size.

15 Claims, 2 Drawing Sheets

PHOTOMASK BLANK, PHOTOMASK AND METHOD OF MANUFACTURE

The present invention relates to a photomask blank and a photomask for use in the microfabrication of semiconductor integrated circuits and high density integrated circuits. It also relates to a method of manufacturing the same.

BACKGROUND OF THE INVENTION

Photolithography using photomasks is employed for the microfabrication of high density semiconductor integrated circuits such as LSI and VLSI, color filters for charge coupled devices (CCD) and liquid crystal displays (LCD), magnetic heads, and the like. The photomasks are prepared from photomask blanks.

The commonly used photomask blank has a light-shielding film formed on a transparent substrate of quartz glass or the like. The light-shielding film is most often in the form of a chromium base film and prepared by such techniques as sputtering and vacuum evaporation.

Photomask blanks of multilayer structure are also known wherein a chromium base film serving as a light-shielding film is formed on its surface side with CrO for preventing light reflection or on both its surface and substrate sides with antireflective films of CrO.

The photomasks of multilayer structure have the advantage of a broad exposure latitude permissible upon pattern imprinting on a wafer. However, they are difficult to produce a mask having good image quality and durability by forming an image on the photomask blank, as compared with the single layer type chromium mask.

More particularly, when the photomask blank of multilayer structure is etched and patterned by conventional lithography, steps are formed in cross-sectional shape between the chromium base light-shielding film and the chromium base antireflective film because of their different etch rates.

On the other hand, the etch rate largely changes midway the film with a likelihood that the film as a whole be unevenly etched. Uneven etching can detract from the sharpness of the image and leave overhangs around the pattern.

To solve these problems, JP-B 62-27386 discloses a photomask blank comprising a nitrogen-containing chromium base light-shielding layer having a continuously changing degree of nitriding; JP-B 62-37386 discloses a photomask blank comprising a carbon-containing chromium base light-shielding layer having a continuously changing degree of carbonization; and JP-B 61-46821 discloses a photomask blank having a changing compositional ratio of chromium oxide to chromium nitride. And JP-A 4-9847 discloses a photomask blank comprising an antireflective film formed of chromium carbide, chromium nitride and chromium oxide in which the degree of oxidation continuously changes.

As mentioned above, a photomask is prepared by starting with a conventional photomask blank and selectively removing the light-shielding film and the antireflective film, whereby the resulting photomask has a low reflective, light-shielding film pattern consisting of the patterned light-shielding film and the patterned antireflective film. A side etch rate can be controlled by taking an appropriate approach when the light-shielding film and the antireflective film are deposited. Such approaches include the addition of oxygen to chromium, formation of oxygen-containing chromium on the light-shielding film, and introduction of oxygen gas into a deposition chamber as the oxygen source. The use of oxygen gas as the oxygen source, however, gives rise to the problem that optical properties such as transmittance, reflectance and refractive index become non-uniform within the substrate plane.

SUMMARY OF THE INVENTION

An object of the invention is to provide a photomask blank and a photomask of quality which have uniform film properties and avoid any degradation of cross-sectional shape caused by differential etch rate between the light-shielding film and the antireflective film. Another object of the invention is to provide methods for preparing the photomask blank and the photomask.

It has been found that when chromium oxynitride carbide is deposited on a transparent substrate by effecting reactive sputtering, the uniformity of optical properties within the substrate plane is improved by using a target of chromium or chromium containing at least one element of oxygen, nitrogen and carbon and a sputtering gas containing at least carbon dioxide gas, a nitrogen-containing gas and an inert gas. This enables controlled deposition of the chromium base film and mass scale production in a consistent manner, ensuring that a high quality chromium base film of chromium oxynitride carbide is obtained. At the same time, the concentration of carbon atoms in the chromium oxynitride carbide is reduced stepwise or continuously from the surface toward the substrate, which enables to control an etch rate, successfully overcoming the above-mentioned problems.

In one aspect, the invention provides a photomask blank comprising a transparent substrate, at least one layer of light-shielding film and at least one layer of antireflective film both on the substrate, wherein the light-shielding film and the antireflective film are formed of a chromium base material containing oxygen, nitrogen and carbon such that the content of carbon decreases stepwise or continuously from a surface side toward the substrate. Preferably, the light-shielding film and the antireflective film each are formed of a chromium oxynitride carbide.

A photomask fabricated by lithographically patterning the photomask blank is also contemplated herein.

In another aspect, the invention provides a method of manufacturing a photomask blank comprising a transparent substrate, at least one layer of light-shielding film and at least one layer of antireflective film both on the substrate. The method involves the step of forming the light-shielding film and the antireflective film by effecting reactive sputtering using a target of chromium or chromium containing at least one element of oxygen, nitrogen and carbon and a sputtering gas containing at least carbon dioxide gas, a nitrogen-containing gas and an inert gas, so that the content of carbon decreases stepwise or continuously from a surface side toward the substrate. Preferably, the light-shielding film and the antireflective film each are formed of a chromium oxynitride carbide. The reactive sputtering step may include changing the proportion of the carbon dioxide gas in the sputtering gas for controlling the content of carbon in chromium oxynitride carbide of the light-shielding film and the antireflective film.

In a further aspect, the invention provides a method of manufacturing a photomask, comprising the step of lithographically patterning the photomask blank manufactured by the above method.

When a chromium base oxide film is deposited on a transparent substrate by a reactive sputtering technique, the invention recommends to use carbon dioxide gas as the oxygen source. Since carbon dioxide is less reactive than oxygen, the gas can uniformly spread and distribute in the chamber over its full extent so that the chromium base film being deposited becomes homogeneous. Furthermore, the content of carbon in the chromium base film is reduced from the surface side toward the transparent substrate, thereby enabling the photomask to be given a pattern having a cross-sectional shape perpendicular to the substrate and free of steps. The photomask thus contributes to the microfabrication of semiconductor ICs of greater density and finer feature size.

The film deposition by sputtering using carbon dioxide gas as the oxygen source can minimize the non-uniformity of optical properties within the substrate plane for the following reason. In the process of flowing oxygen or another reactive gas into a deposition chamber from its inlet, oxygen is successively consumed for oxidation from a position nearer to the inlet, that is, the degree of oxidation is higher at a position nearer to the inlet. When oxygen is fed from without the target, oxygen is consumed on the outside of the target so that the concentration of oxygen lowers toward the inside. As a result, the degree of oxidation increases from the center of the chamber toward the outside, producing a distribution of reflectance and optical constants.

In contrast, the invention uses low reactivity carbon dioxide gas as the oxygen source in reactive sputtering. Since the carbon dioxide gas is little consumed until it is activated by a plasma, it can uniformly spread throughout the chamber so that a film being deposited may have a more uniform degree of oxidation. As a result, the distribution of optical properties within the substrate plane is drastically improved. Film properties can be controlled by using both carbon dioxide gas and an inert gas as the sputtering gas and adjusting the mixing ratio therebetween.

Further, the content of carbon in chromium oxynitride carbide is reduced stepwise or continuously from the surface toward the transparent substrate, so that there are available a slow etch rate on the surface side and a fast etch rate on the substrate side. The resulting pattern has a cross-sectional shape perpendicular to the substrate and having no steps. The precision of pattern transfer is dramatically improved. The carbon content can be easily adjusted by stepwise or continuously changing the mixing ratio of inert gas and carbon dioxide gas in the sputtering gas.

BRIEF DESCRIPTION OF THE DRAWINGS

The above and other objects, features and advantages of the invention will become more apparent from the following detailed description, taken in conjunction with the accompanying drawings.

FIG. 3 illustrates in sectional view the method of manufacturing a photomask according to the invention.

DESCRIPTION OF THE PREFERRED EMBODIMENT

Figure 1:
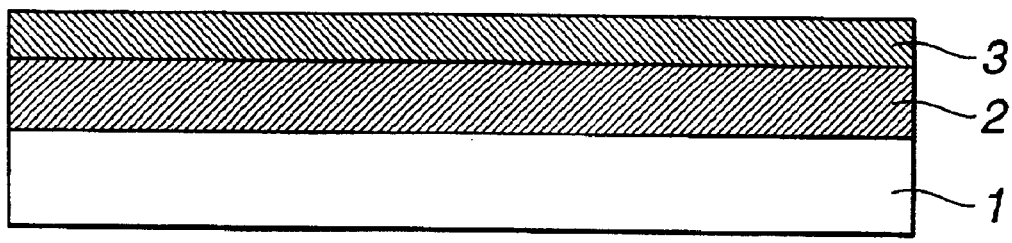
FIG. 1 is a sectional view of a photomask blank according to one embodiment of the invention.

Referring to FIG. 1, the photomask blank of the invention is illustrated as comprising a substrate 1 and a chromium base light-shielding film 2 thereon, and a chromium base antireflective film 3 on the film 2. The substrate 1 is made of a material such as quartz or $CaF_2$ that is transparent to the exposure light. The chromium base light-shielding film 2 is deposited on the substrate by reactive sputtering using a target of chromium or chromium containing at least one element of oxygen, nitrogen and carbon and a sputtering gas containing at least carbon dioxide gas, a nitrogen-containing gas and an inert gas, for thereby forming a chromium base film having a low carbon content. The film 2 is typically composed of chromium oxynitride carbide (CrONC). The chromium base antireflective film 3 is deposited by similar reactive sputtering, for thereby forming a chromium base film having a high carbon content. The film 3 is typically composed of chromium oxynitride carbide (CrONC).

The lower layer of chromium base light-shielding film has a preferred composition consisting essentially of 50 to 90 at %, especially 60 to 80 at % of Cr, 2 to 15 at %, especially 3 to 7 at % of C, 10 to 30 at %, especially 12 to 20 at % of O, and 2 to 20 at %, especially 5 to 15 at % of N. The upper layer of chromium base antireflective film has a preferred composition consisting essentially of 20 to 60 at %, especially 35 to 50 at % of Cr, 5 to 30 at %, especially 6 to 15 at % of C, 20 to 55 at %, especially 25 to 50 at % of O, and 5 to 25 at %, especially 10 to 20 at % of N.

The invention requires that the content of carbon in the film structure consisting of light-shielding film and antireflective film lower stepwise or continuously from the surface side toward the substrate. In one embodiment, the light-shielding film and the antireflective film each have a fixed film composition, and the carbon content of the upper or antireflective film is higher than the carbon content of the lower or light-shielding film, preferably the carbon content of the upper or antireflective film is greater than the carbon content of the lower or light-shielding film by 3 to 15 at %, especially 3 to 8 at %. In another embodiment, the maximum carbon content of the lower or light-shielding film is smaller than the minimum carbon content of the upper or antireflective film, and either one or both of the upper or antireflective film and the lower or light-shielding film have a higher carbon content on the surface side and a lower carbon content on the substrate side.

The method of forming the chromium base light-shielding film and chromium base antireflective film is a reactive sputtering technique. The target used herein for sputtering is chromium. Chromium having added thereto oxygen, nitrogen, carbon or mixtures of any may be used, if necessary.

The sputtering technique may employ either a direct-current power supply (d.c. sputtering) or a high-frequency power supply (RF sputtering). The use of magnetron sputtering or conventional sputtering is also possible.

The sputtering gas has a composition comprising at least an inert gas such as argon or krypton, carbon dioxide gas and a nitrogen-containing gas. The flow ratio of respective gases varies with the sputtering apparatus, power and other factors. Usually, the molar ratio of inert gas to carbon dioxide is from about 1:0.05 to about 1:1. The mixing ratio of carbon dioxide gas is gradually increased as deposition proceeds from the substrate side, whereby the carbon content in the film composition can be changed stepwise or continuously in a thickness direction. Besides the inert gas and carbon dioxide gas, the nitrogen-containing gas (nitrogen-providing gas such as nitrogen gas or various nitrogen oxide gases) is added to the sputtering gas so that the chromium base film being deposited may have the desired composition of CrONC.

Figure 2:
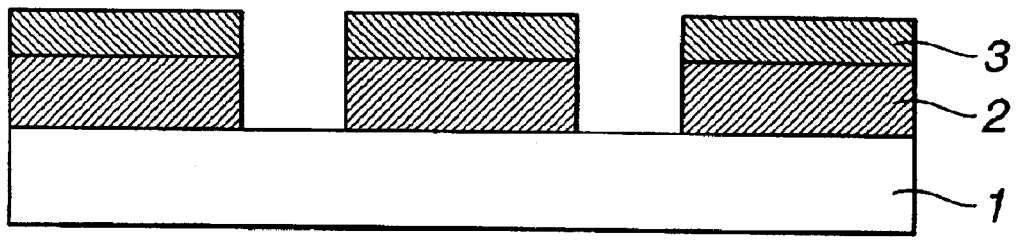
FIG. 2 is a sectional view of a photomask obtained therefrom.
Figure 3A:
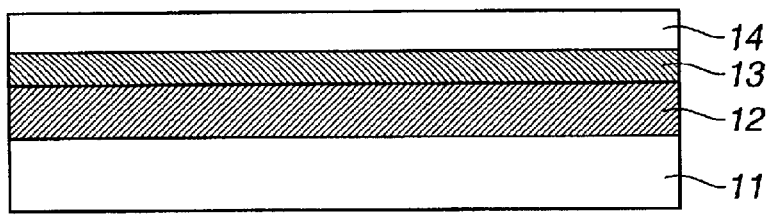
FIG. 3A shows the photomask blank on which a resist film has been formed.
Figure 3B:
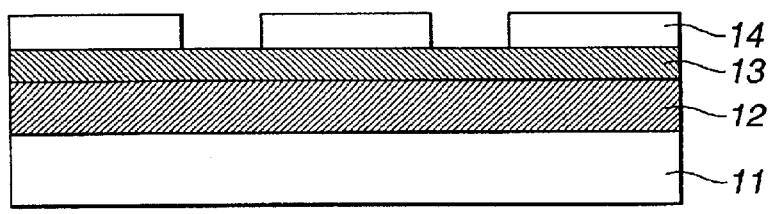
FIG. 3B shows the structure after the resist film has been patterned.
Figure 3C:
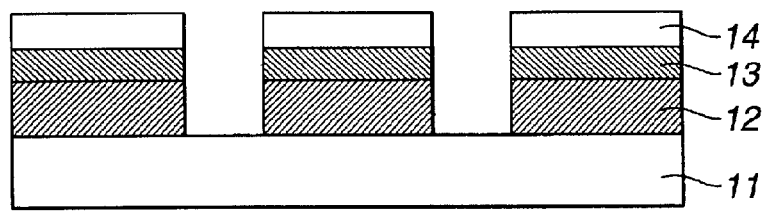
FIG. 3C shows the structure after dry or wet etching.
Figure 3D:
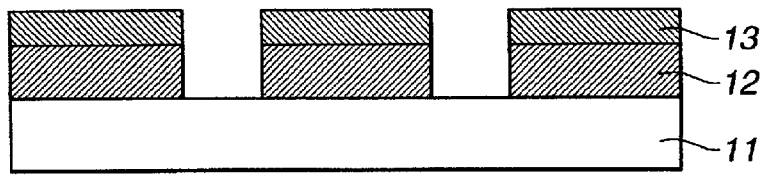
FIG. 3D shows the structure after the resist film has been removed.

By lithographically patterning the photomask blank shown in FIG. 1, a photomask having two layers of CrOCN as shown in FIG. 2 is obtained. A precise pattern having a cross-sectional shape perpendicular to the substrate can be formed.

The photomask is manufactured from the photomask blank by the method according to the invention, which is illustrated in FIG. 3. As shown in FIG. 3A, a resist film 14 is formed on a photomask blank which has been prepared by forming a CrCON layer 12 having a low carbon concentration on a substrate 11, then forming a CrCON layer 13 having a high carbon concentration on the CrCON layer 12 as mentioned above. The resist film 14 is patterned as shown in FIG. 3B. The CrCON layers 12 and 13 are then dry or wet etched as shown in FIG. 3C. Finally the resist film 14 is stripped off as shown in FIG. 3D. In this process, application of the resist film, patterning (exposure and development), dry or wet etching, and removal of the resist film may be carried out by known methods.

The chromium base films used herein may be three layer films including CrCON antireflective films on both the surfaces of the CrCON light-shielding film which are disposed remote from and adjacent to the transparent substrate. The invention can also be combined with a phase shifter film capable of altering the phase of exposure wavelength. The invention is applicable to not only transmissive masks, but also reflective masks.

EXAMPLES

The following examples are provided by way of illustration, and are not intended to limit the scope of the invention.

Example 1

On a 6" quartz glass substrate which had been precision polished on both surfaces, a CrCON film of 70 nm thick was deposited by DC sputtering a target of metallic chromium in an atmosphere of a mixture of 78 mol % of Ar, 5 mol % of $CO_2$ and 17 mol % of $N_2$ as the sputtering gas, and under conditions including a gas pressure of 0.2 Pa and a power of 250 W during discharge. This CrCON film was analyzed by electron spectroscopy for chemical analysis (ESCA) to find a composition consisting of 76 at % Cr, 3 at % C, 16 at % O and 5 at % N. By consecutive sputtering in an atmosphere of a mixture of 53 mol % of Ar, 27 mol % of $CO_2$ and 20 mol % of $N_2$ as the sputtering gas, a CrCON film of 30 nm thick was deposited. The overlying CrCON film was analyzed by ESCA to find a composition consisting of 44 at % Cr, 9 at % C, 34 at % O and 13 at % N. The results are shown in Table 1.

The optical properties of the uppermost surface of the CrCON film was examined. Specifically, using NANOSPEC by Nanometrics Co., a reflectance at a wavelength of 436 nm was measured at intervals of 5 mm. The variance D was 0.032, as expressed by the following equation:

$$D=(max-min)/(max+min)$$

wherein "max" is a maximum measured reflectance and "min" is a minimum measured reflectance.

Comparative Example 1

On a 6" quartz glass substrate which had been precision polished on both surfaces, a CrCON film of 70 nm thick was deposited by DC sputtering a target of metallic chromium in an atmosphere of a mixture of 73 mol % of Ar, 5 mol % of $CH_4$, 5 mol % of $O_2$ and 17 mol % of $N_2$ as the sputtering gas, and under conditions including a gas pressure of 0.2 Pa and a power of 250 W during discharge. This CrCON film was analyzed by ESCA to find a composition consisting of 75 at % Cr, 8 at % C, 12 at % O and 5 at % N. By subsequent sputtering in an atmosphere of a mixture of 40 mol % of Ar, 20 mol % of $CH_2$, 20 mol % of $O_2$ and 20 mol % of $N_2$ as the sputtering gas, a CrCON film of 30 nm thick was deposited. The overlying CrCON film was analyzed by ESCA to find a composition consisting of 42 at % Cr, 5 at % C, 30 at % O and 23 at % N. The results are shown in Table 1.

The optical properties of the uppermost surface of the CrCON film was examined. Specifically, a reflectance at a wavelength of 436 nm was measured at intervals of 5 mm by means of NANOSPEC, finding a variance D of 0.23.

TABLE 1

| | | Example 1<br>Film composition<br>(at %) | | | | Comparative<br>Example 1<br>Film composition<br>(at %) | | | |
|---|---|---|---|---|---|---|---|---|---|
| | | Cr | C | O | N | Cr | C | O | N |
| Light-shielding film | CrCON | 76 | 3 | 16 | 5 | 75 | 8 | 12 | 5 |
| Antireflective film | CrCON | 44 | 9 | 34 | 13 | 42 | 5 | 30 | 23 |
| Variance of reflectance<br>@450 nm | | 0.032 | | | | 0.23 | | | |

Next, the photomask blanks prepared in Example 1 and Comparative Example 1 were etched in a pattern. The shape in cross section of the pattern was observed. A substrate-adjoining film having a lower carbon content led to a better shape because of a nearly perpendicular inclination angle. Also the use of carbon dioxide gas resulted in a smooth cross-sectional shape.

There has been described a photomask blank which can be etched at a readily controllable rate to define a pattern of perpendicular cross-sectional shape. The photomask blank and the photomask have uniform film properties and high quality and contribute to the microfabrication of semiconductor ICs of great %r density and finer feature size.

Japanese Patent Application No. 2001-035783 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

We claim:

1. A photomask blank comprising a transparent substrate, at least one layer of light-shielding film and at least one layer of antireflective film both on the substrate, wherein said light-shielding film and said antireflective film are formed of a chromium base material containing oxygen, nitrogen and carbon such that the content of carbon decreases stepwise or continuously from a surface side toward the substrate.

2. The photomask blank of claim 1 wherein said light-shielding film and said antireflective film each are formed of a chromium oxynitride carbide.

3. A photomask fabricated by lithographically patterning the photomask blank of claim 1.

4. The photomask blank of claim 1, wherein a lower layer of said at least one layer of light-shielding film consists essentially of 50 to 90 at % of Cr, 2 to 15 at % of C, 10 to 30 at % of O, and 2 to 20 at % of N.

5. The photomask blank of claim 1, wherein a lower layer of said at least one layer of light-shielding film consists essentially of 60 to 80 at % of Cr, 3 to 7 at % of C, 12 to 20 at % of O, and 5 to 15 at % of N.

6. The photomask blank of claim 1, wherein an upper layer of said at least one layer of antireflective film consists essentially of 20 to 60 at % of Cr, 5 to 30 at % of C, 20 to 55 at % of O, and 5 to 25 at % of N.

7. The photomask blank of claim 1, wherein an upper layer of said at least one layer of antireflective film, consists essentially of 35 to 50 at % of Cr, 6 to 15 at % of C, 25 to 50 at % of O, and 10 to 20 at % of N.

8. A method of manufacturing a photomask blank comprising a transparent substrate, at least one layer of light-shielding film and at least one layer of antireflective film both on the substrate, said method comprising the step of forming said light-shielding film and said antireflective film by effecting reactive sputtering using a target of chromium or chromium containing at least one element of oxygen, nitrogen and carbon and a sputtering gas containing at least carbon dioxide gas, a nitrogen-containing gas and an inert gas, so that the content of carbon decreases stepwise or continuously from a surface side toward the substrate.

9. The method of claim 8 wherein said light-shielding film and said antireflective film each are formed of a chromium oxynitride carbide.

10. The method of claim 9 wherein said reactive sputtering step includes changing the proportion of the carbon dioxide gas in the sputtering gas for controlling the content of carbon in chromium oxynitride carbide of said light-shielding film and said antireflective film.

11. A method of manufacturing a photomask, comprising the step of lithographically patterning the photomask blank manufactured by the method of claim 8.

12. The method of claim 8, wherein a lower layer of said at least one layer of light-shielding film consists essentially of 50 to 90 at % of Cr, 2 to 15 at % of C, 10 to 30 at % of O, and 2 to 20 at % of N.

13. The method of claim 8, wherein a lower layer of said at least one layer of light-shielding film consists essentially of 60 to 80 at % of Cr, 3 to 7 at % of C, 12 to 20 at % of O, and 5 to 15 at % of N.

14. The method of claim 8, wherein an upper layer of said at least one layer of antireflective film consists essentially of 20 to 60 at % of Cr, 5 to 30 at % of C, 20 to 55 at % of O, and 5 to 25 at % of N.

15. The method of claim 8, wherein an upper layer of said at least one layer of antireflective film, consists essentially of 35 to 50 at % of Cr, 6 to 15 at % of C, 25 to 50 at % of O, and 10 to 20 at % of N.

* * * * *